United States Patent [19]
Sandhu et al.

[11] Patent Number: 5,888,906
[45] Date of Patent: Mar. 30, 1999

[54] PLASMALESS DRY CONTACT CLEANING METHOD USING INTERHALOGEN COMPOUNDS

[75] Inventors: Gurtej S. Sandhu; Donald L. Westmoreland, both of Boise, Id.

[73] Assignee: Micron Technology, Inc., Boise, Id.

[21] Appl. No.: 714,651

[22] Filed: Sep. 16, 1996

[51] Int. Cl.⁶ .................................................. H01L 21/302
[52] U.S. Cl. .......................... 438/706; 438/723; 438/743; 438/906; 252/79.1; 134/1.3
[58] Field of Search .................... 438/700, 706, 438/722, 723, 743, 906; 252/79.1; 134/1.3

[56] References Cited

U.S. PATENT DOCUMENTS

| | | | |
|---|---|---|---|
| 4,279,691 | 7/1981 | Aoki et al. | 216/95 |
| 5,030,319 | 7/1991 | Nishino et al. | 156/635 |
| 5,296,095 | 3/1994 | Nabeshima et al. | 216/79 |
| 5,326,406 | 7/1994 | Kaneko et al. | 134/1 |
| 5,380,401 | 1/1995 | Jones et al. | 156/665 |
| 5,403,435 | 4/1995 | Cathey et al. | 156/643 |
| 5,409,563 | 4/1995 | Cathey | 156/643 |
| 5,546,890 | 8/1996 | Tamaki et al. | 438/905 |
| 5,609,721 | 3/1997 | Tsukune et al. | 216/58 |
| 5,716,494 | 2/1998 | Imai et al. | 156/643.1 |
| 5,716,495 | 2/1998 | Butterbaugh et al. | 156/643.1 |
| 5,728,259 | 3/1998 | Suzawa et al. | 156/646.1 |
| 5,757,456 | 5/1998 | Yamazaki et al. | 349/151 |

FOREIGN PATENT DOCUMENTS

| | | |
|---|---|---|
| 3-243688 A | 10/1991 | Japan . |
| 3-272135 A | 12/1991 | Japan . |
| 7-193055 | 7/1993 | Japan .......................... H01L 21/3065 |
| 5-198538 A | 8/1993 | Japan . |
| 7-193055 A | 7/1995 | Japan . |
| 8-213367 | 8/1996 | Japan .......................... H01L 21/3065 |
| 8-213367 A | 8/1996 | Japan . |

OTHER PUBLICATIONS

Ibbotson, D.E. et al "Plasmaless dry etching of silicon with fluorine–containing compounds" J. Appl. Phys. 56 (10), pp. 2939–2942, Nov. 1984.

Saito et al., "Plasmaless cleaning process of silicon surface using cholorine triflouride," *Appl. Phys. Lett.*, 56(12) 1119–1121 (1990).

*Primary Examiner*—R. Bruce Breneman
*Assistant Examiner*—Anita Alanko
*Attorney, Agent, or Firm*—Mueting, Raasch & Gebhardt, P.A.

[57] ABSTRACT

A method of removing an oxide layer from an article. The article is located in a reaction chamber. An interhalogen compound reactive with the oxide layer is introduced into the reaction chamber. The interhalogen compound forms volatile by-product gases upon reaction with the oxide layer. For compounds that form volatile chlorides, bromides or iodides, a reducing gas, such as for example hydrogen, ammonia, amines, phosphine, silanes, and higher silanes, may optionally be added simultaneously with the interhalogen to form a volatile by-product. Unreacted interhalogen compound and volatile by-product gases are removed from the reaction chamber. In one embodiment, the temperature in the reaction chamber may be elevated prior to or after introducing the interhalogen compound. In another embodiment, a metal layer is deposited in-situ on a portion of the article within the reaction chamber.

25 Claims, 3 Drawing Sheets

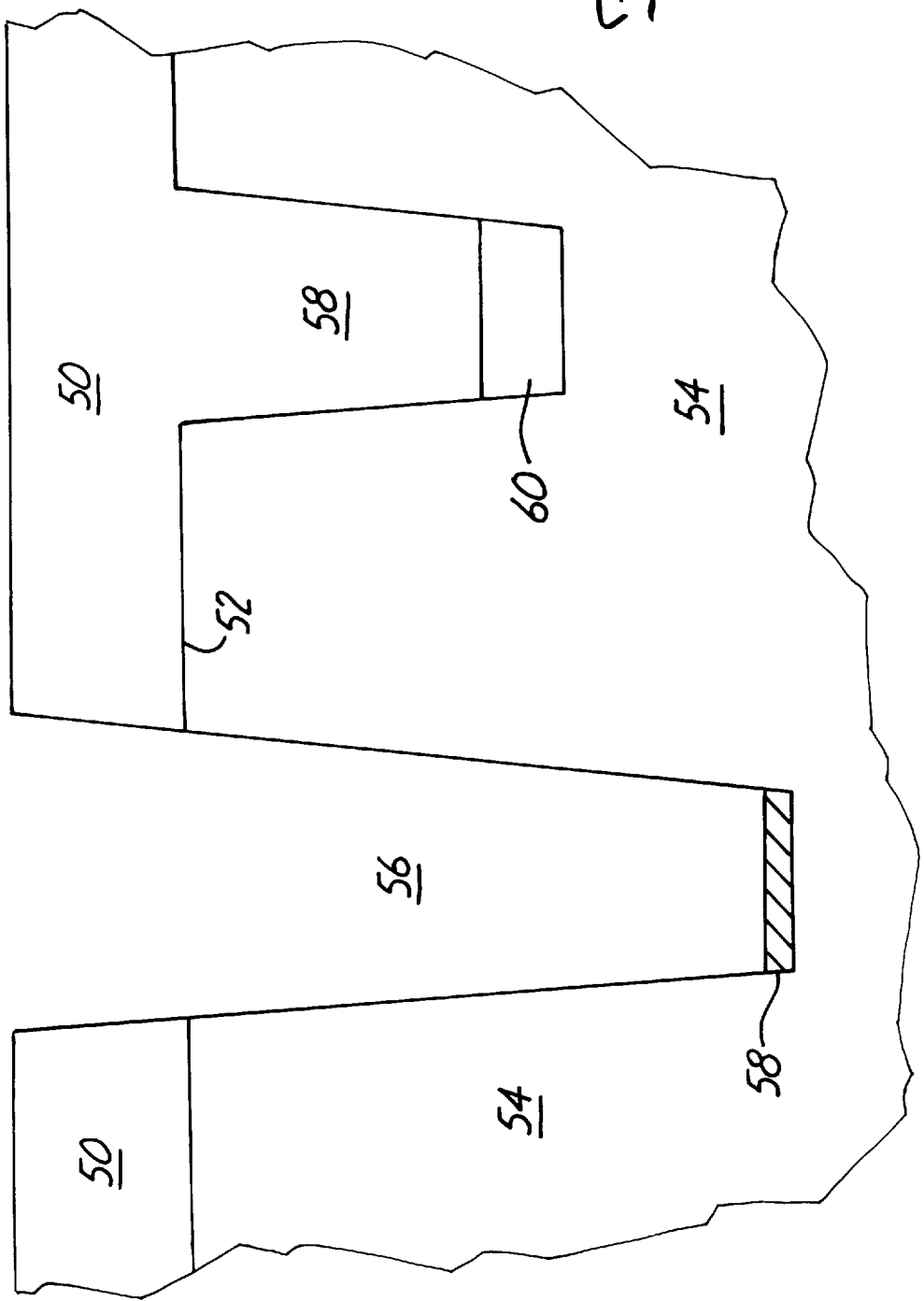

PLASMALESS DRY CONTACT CLEANING METHOD USING INTERHALOGEN COMPOUNDS

FIELD OF THE INVENTION

The present invention relates to the use of interhalogen compounds to clean substrates to remove or prevent the formation of oxides, and in particular, the use of interhalogen compounds to clean contacts in-situ prior to metal deposition on silicon wafers.

BACKGROUND OF THE INVENTION

Reactive ion etching is a process whereby a low pressure gas is subject to a radio frequency electric field in a reaction chamber to form a plasma. A plasma is a gas which contains positive, negative and neutral atoms, and/or molecules including radicals and a "gas" of emitted photons. The ions and radicals in the plasma that form the etchants are accelerated by an electric field against the material to be etched. The ions/radicals interact with the surface of the atoms or molecules within the material to be etched, forming a volatile by-product which is subsequently removed from the reaction chamber.

If a chemically inert gas, such as argon, is ionized and accelerated to impinge on a substrate surface, material can be removed from the surface of the substrate by momentum transfer, a process similar to sand blasting. This process is used in three distinct modes: sputter etching, ion-beam milling and focused ion beam etching. Sputter etching and broad-ion beam milling use high-energy, inert gas ions (typically $Ar^+$) to dislodge material from the substrate surface, a highly anisotropic etch process. Anisotropic etching occurs when the etch rate is considerably greater in one direction then in another (also known as unidirectional etching). Isotropic etch refers to etching in all directions at a relatively even rate.

The inherent poor selectivity and slow etch rate of these purely physical processes, however, severely limit their use in the cleaning of sub-micron patterns. It can be difficult to focus plasma to the bottom of high aspect ratio (depth:width) features. The anisotropic nature of dry etching makes it difficult to clean two or more surfaces. For example, it is often desirable to clean the bottom and side walls of a high aspect ratio feature on a substrate. Plasma reactors are difficult to modify to perform both the etching process and metal deposition. Finally, the sputtered material is typically non-volatile and tends to re-deposit onto the substrate and elsewhere in the system.

The ion bombardment in reactive ion etching can also result in a charge build-up on insulated surfaces, resulting in damage to the underlying film and semiconductor surface exposed to ion bombardment. For example, if the beam strikes a conducting grounded surface, sufficient secondary electrons are generated to balance the space charge of the beam and external neutralization is not necessary. If ions impinge on an insulated surface, however, positive charge can build-up on the surface, damaging the underlying insulator and semiconductor surface. When accumulated surface charge causes excessive current to pass through an insulator, the damage to the dielectric can be permanent.

Wet process cleaning to remove native oxides is limited in that the surface tension of the liquid inhibits penetration down into surface features with small lateral dimensions or high aspect ratios. Wet process cleaning is difficult to control. Finally, it is difficult to integrate wet process cleaning in the same equipment with metal deposition.

SUMMARY OF THE INVENTION

The present invention is directed to the use of interhalogen compounds to perform cleaning of a substrate to remove or prevent the formation of oxide layers. The oxide layer may be a native oxide layer or some other oxide. The present invention is particularly useful in cleaning high aspect ratio surface features on substrates. The present invention is also directed to the use of interhalogen compounds to clean contacts in-situ prior to metal deposition of silicon wafers.

One embodiment of the method of the present invention is directed to removing an oxide layer from at least one surface feature on an article. The article is located in a reaction chamber. An interhalogen compound reactive with the oxide layer is introduced into the reaction chamber. The interhalogen compound forms by-product gases upon reaction with the oxide layer. Unreacted interhalogen compound and by-product gases are removed from the reaction chamber.

A photoresistive layer impervious to the interhalogen compound may optionally be deposited on a portion of the article to selectively clean the article. One or more surface of the surface feature may be cleaned using the method of the present invention.

In one embodiment, the temperature in the reaction chamber is elevated during or after introduction of the interhalogen compound. In another embodiment, a metal layer is deposited in-situ on a portion of the article within the reaction chamber. In yet another embodiment, the reaction chamber comprises a chemical vapor deposition reaction chamber.

The interhalogen compound is selected from a group consisting of $ClF_3$, $BrF_3$, $ClF_5$, $IF_5$, $IF_7$, ClF, BrCl, IBr, ICl, and BrF. In one embodiment, the interhalogen compound is preferably a complex interhalogen gas. Alternatively, the interhalogen compound may be a liquid or solid at room temperature. Non-fluorine-containing interhalogen may also be used. For compounds that form volatile chlorides, bromides or iodides, a reducing gas, such as for example hydrogen, ammonia, amines, phosphine, silanes; and higher silanes, may optionally be added simultaneously with the interhalogen to form a volatile by-product.

The article may be a silicon wafer or a non-silicon metal or metalloid substrate. The surface feature having one or more lateral dimensions of less than 2 micrometers, or alternatively, less than 0.5 micrometers may be cleaned using the present method. The surface feature may have an aspect ratio of at least 1:1, although it will be understood surface features with aspect ratios greater than 40:1 may be cleaned with the present method.

The present invention is also directed to a method of in-situ removal of an oxide layer from a silicon wafer in a chemical vapor deposition chamber prior to metal deposition. Specifically, the method of in-situ removal of an oxide layer from a silicon wafer in a chemical vapor deposition chamber prior to metal deposition, comprises the steps of: locating the silicon wafer in a reaction chamber; introducing an interhalogen compound reactive with the oxide layer into the reaction chamber, the interhalogen compound forming by-product gases upon reaction with the oxide layer; evacuating unreacted interhalogen compound and by-product gases from the reaction chamber; and depositing a metal layer on a portion of the article within the reaction chamber.

The method of the present invention can also be used to remove an oxide layer from an article that may not have a surface feature as described herein. This method can use either a non-fluorine-containing interhalogen compound reactive with the oxide layer and/or an article having a non-silicon surface.

As used in this application:

"Complex interhalogen" refers to non-diatomic interhalogens, such as tetra-atomic, hexa-atomic and octa-atomic interhalogens;

"Lateral dimension" refers to a dimension measured generally parallel to the surface of the substrate, such as width and diameter of a surface feature; and "Surface features" refers to a trench, via, hole, depression or other deviations from a planar surface.

BRIEF DESCRIPTION OF THE DRAWINGS

FIG. 3 is a schematic illustration of a substrate surface being selectively cleaned.

DETAILED DESCRIPTION OF THE PREFERRED EMBODIMENT(S)

The present invention is directed to the use of interhalogen compounds to remove oxide layers prior to metal deposition. The cleaning may involve selective removal of materials, such as at a contact, or cleaning of the entire substrate without patterning, as will be discussed below. The cleaning is preferably performed in-situ before metal deposition so as to prevent the formation of native oxides at the contact interface. Alternatively, reformation of the oxide layer can be prevented by storing the cleaned substrates in argon or some other inert gas or transferring the substrates directly from the cleaning location to the metal film deposition location via automated material handling equipment.

Figure 1:
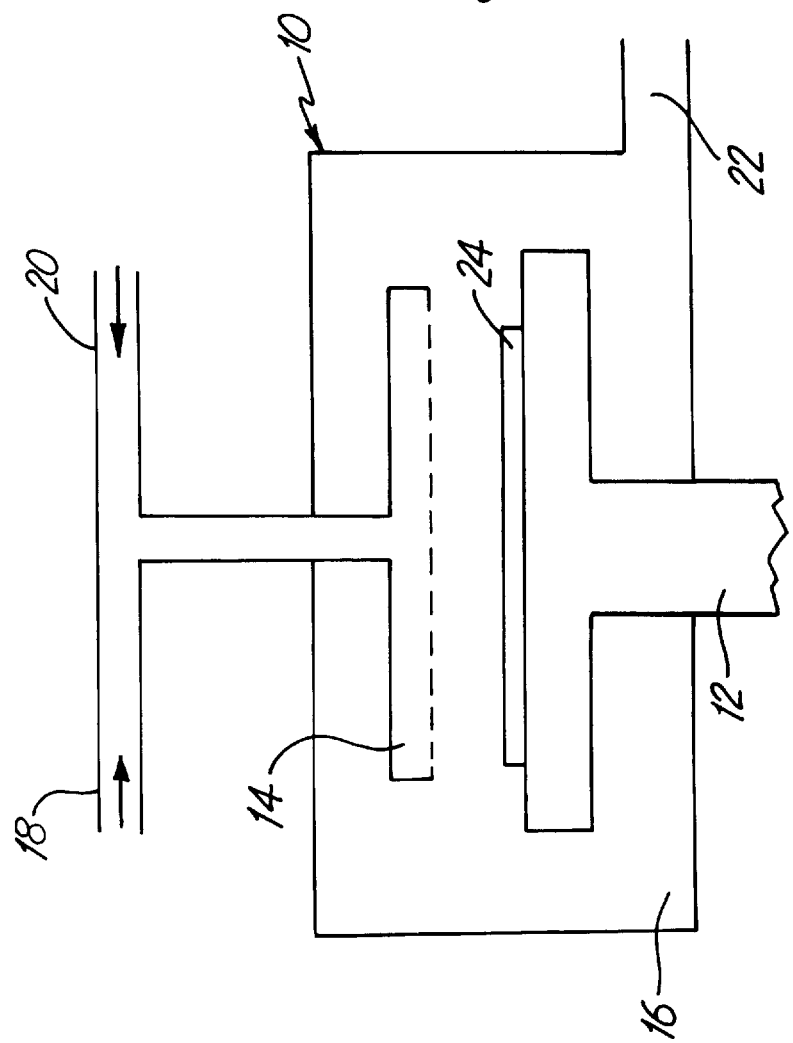
FIG. 1 is a schematic illustration of a generic reactor for chemical-vapor deposition (CVD) suitable for use with the present in-situ cleaning of contacts prior to metal deposition.

FIG. 1 illustrates a generic reactor 10 suitable for use with the present in-situ cleaning of contacts prior to metal deposition. A combination substrate chuck and heater 12 is located beneath a gas distribution shower head 14 within a reaction chamber 16. The interhalogen compounds are introduced through the inlets 18, which are preferably gas inlets. Reaction by-products are drawn from the reaction chamber 16 through a vent 22 by a vacuum pump (not shown). The substrate 24 is located on the chuck 12 in the reaction chamber 16. The inside surface of the reaction chamber 16 may be constructed of steel to minimize reaction with the interhalogen compounds. The chemical-vapor deposition gas is typically introduced through gas inlet 20.

An interhalogen gas or vapor from a high vapor pressure liquid may be introduced into the inlet 18, or by other suitable means, to perform in-situ cleaning of substrate 24 prior to metal deposition. The reaction chamber is preferably heated to a temperature of about −20° C. to about 700° C. for a period of about 10 seconds to about 10 minutes. Pressure is preferably maintained within the reaction chamber 16 at about 0.0133 Pa to about 101,325 Pa. It will be understood that the optimum temperature and pressure are a function of the interhalogen and the oxide being cleaned. The interhalogen compound may be removed from or flushed-out of the reaction chamber through the vent 22 by introduction of an inert gas at the inlet 18, such as argon. The argon also serves to prevent the formation of native oxides on the substrate 24 prior to metal deposition. After cleaning, CVD may be performed in the reaction chamber 16 without removal or handling of the substrate 24. It will be understood that the present in-situ cleaning of contacts using interhalogen compounds may be performed in a variety of reactors, including barrel reactors and vertical reactors.

The substrate 24 is typically a silicon wafer containing a layer of borophosphosilicate glass (BPSG). It will be understood, however, that the substrate 24 may be a silicon-containing material or a non-silicon containing metal or metalloid material.

Interhalogen compounds generally exist in four stoichiometries: XY, $XY_3$, $XY_5$ and $XY_7$ where X is the heavier halogen. A few ternary compounds are also known, such as $IFCl_2$ and $IF_2Cl$. For the hexatomic series, only the fluorides are known. The interhalogen compounds suitable for use in the present invention include without limit ClF, BrCl, IBr, ICl, BrF, $ClF_3$, $BrF_3$, $ClF_5$, $BrF_5$, and $IF_5$.

For use in the present invention, interhalogens that are either gases or high vapor pressure liquids at room temperature are preferred due to ease of delivery into the reaction chamber. It is also possible to use interhalogens in solid form at room temperature by heating to the point of sublimation prior to or after introduction into the reaction chamber. Interhalogens that are solids at room temperature include, for example, $IF_7$, ICl, and IBr. For example, it is possible to heat the interhalogen prior to delivery into the reaction chamber and maintain an elevated temperature using the heating element in the chuck 12 or other suitable methods. Table 1 summarizes the boiling point and melting point in ° C. of selected interhalogens.

TABLE 1

| Property | $ClF_3$ | $BrF_3$ | $IF_3$*** | $ClF_5$ | $BrF_5$ | $IF_5$ | $IF_7$ |
|---|---|---|---|---|---|---|---|
| MP/°C. | −76.3 | 8.8 | — | −103 | −60.5 | 9.4 | 6.5* |
| BP/°C. | 11.8 | 125.8 | — | −13.1 | 41.3 | 104.5 | 4.8** |

*triple point
**Sublimes at 1 atm
***$IF_3$ is a yellow solid at room temperature Metal or metalloid species may be cleaned using the present interhalogen cleaning method as long as the resultant metal or metalloid halide forms a gas. Typically, this excludes alkali metals and alkaline earth metals of the Periodic Table. Suitable metals and metalloids include transition metals, i.e., those elements in the Periodic Table with their outermost electrons in "d" orbitals; lanthanides and actinides, i.e., those elements in the Periodic Table with their outermost electrons in "f" orbitals; the heavier elements of Group IIIA, i.e., Group 13 (Al, Ga, In, Ti); the heavier elements of Group IVA, i.e., Group 14 (Sn, Pb); the heavier elements of Group VA, i.e., Group 15 (Bi), and the metalloids (B, Si, Ge, As, Sb, Te).

Interhalogens are useful in removing metal oxides that readily form a volatile halide in the presence of a interhalogen. Although fluorine based interhalogens are preferred, the interhalogen is generally matched with the metal or metalloid being cleaned to provide a volatile product. In particular, fluorine containing interhalogens may or may not produce a volatile product upon reacting with certain oxide layers.

Some interhalogen compounds do not form volatile fluorides, but form volatile chlorides, bromides or iodides, such as aluminum or titanium halides. For example, non-fluorine containing interhalogens such as ICl may be used in combination with hydrogen or some other reducing gas to form volatile metal halides, such as titanium chloride or aluminum chloride. Examples of native oxides that can be removed using non-fluorine containing interhalogens, with or without hydrogen or some other reducing gas, include silicon dioxide, aluminum oxide and titanium oxide. Possible reducing gases include hydrogen, ammonia, amines, phosphine, silanes; and higher silanes.

The by-products are typically in gaseous form and are easily removed from the vent 22 of the reaction chamber 16 by introducing additional interhalogen compounds or an inert gas. The by-products typically include metal fluorides or chlorides, bromides, iodides, main group fluorides, chlorides, bromides or iodides, organofluorides, chlorides bromides or iodides and diatomic halogens. The gaseous nature of the by-products facilitates removal from the reaction chamber, as illustrated in FIG. 2.

Figure 2:
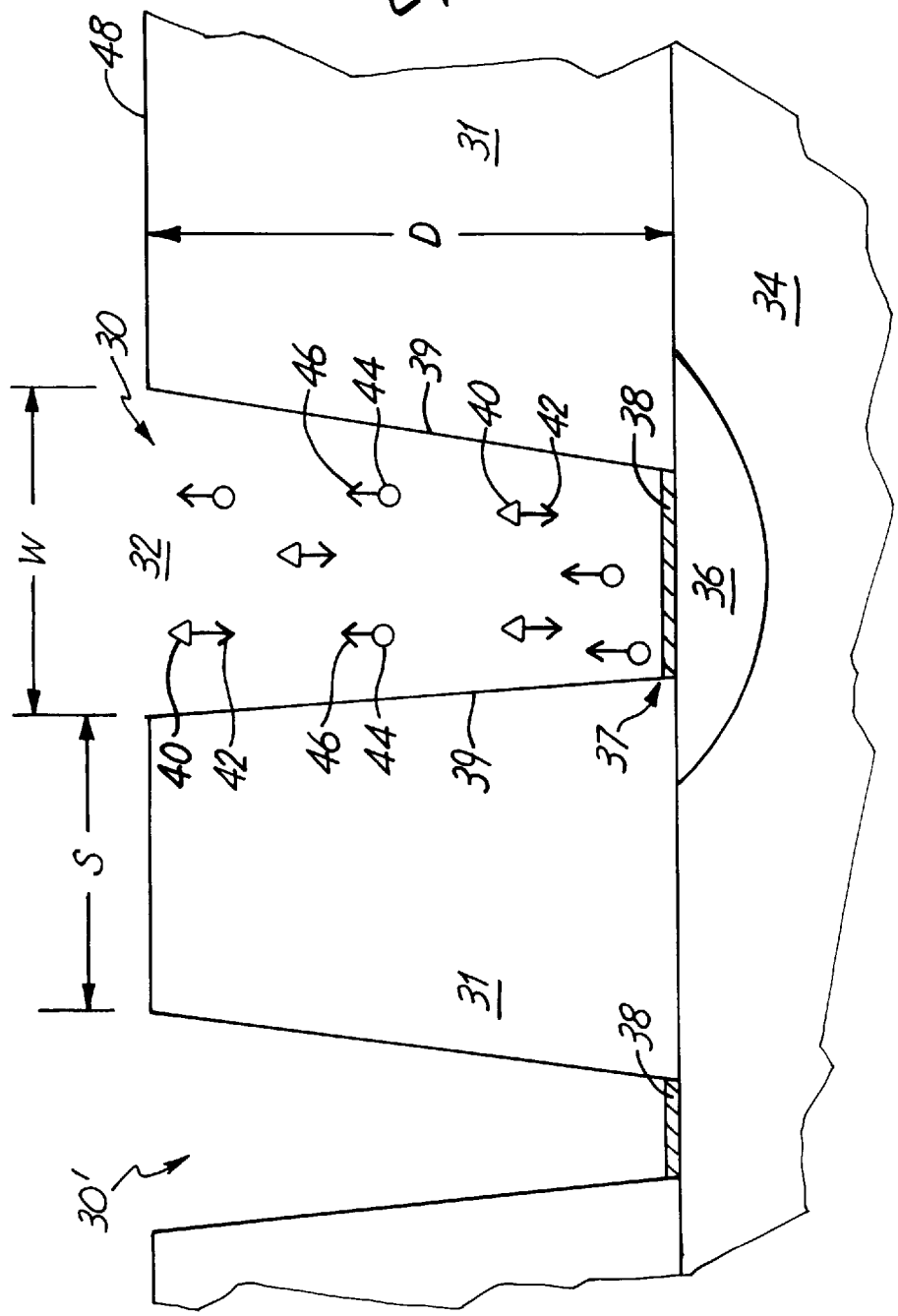
FIG. 2 is a schematic illustration of a pair of adjacent high aspect ratio contacts being cleaned showing the diffusion of reactant gases into the trench and the diffusion of by-product molecules out of the trench.

FIG. 2 illustrates a high aspect ratio trench 30 in a borophosphosilicate glass (BPSG) layer 31 on a silicon substrate 34 having an opening 32. The trench 30 has a width or diameter "W" and a depth "D", yielding an aspect ratio of D:W. Width and diameter are collectively referred to herein as the lateral dimension. An adjacent trench 30' is located a distance "S" from the trench 30. A doped silicon region 36 at bottom 37 of the trench 30 is covered by a native oxide layer 38 of silicon dioxide.

Interhalogen compound 40 reacts with the silicon dioxide 38 along the bottom 37 of the trench 30. The diffusion of the interhalogen compound 40 is thermally random but a net diffusion is downward into the trench 30 as indicated by downward arrows 42. The by-product molecules 44 are indicated by the circles. The diffusion of the by-product molecules 44 is thermally random but a net diffusion is upward through the opening 32 of the trench 30 as indicated by upward arrows 46. The concentration of the interhalogen compound 40 and the by-product molecules 44 varies with the aspect ratio of the trench 30. In general, the interhalogen compound 40 is more concentrated at shallow depths close to the surface 48 of the BPSG layer 31, and become less concentrated toward the bottom 37. The present method is isotropic in nature and is therefore useful in cleaning multiple surfaces simultaneously, such as the bottom 37 and side walls 39 of a trench 30, where appropriate.

High aspect ratio surface features, such as trench 30, typically fall in the range of about 1:1 to about 5:1, and more likely in a range of about 1:1 to about 20:1, although it will be understood that aspect ratios in the range of about 1:1 to about 40:1 are possible. The present interhalogen cleaning method is well suited for use in cleaning surface features having one or more lateral dimensions W of less than about 2 microns, although surface features less than about 0.5 micron may be cleaned.

FIG. 3 illustrates an alternative embodiment in which a photoresist 50 is optionally deposited on a surface 52 to selectively clean portions of substrate 54. The photoresist 50 does not extend into trench 56 so that the native oxide layer 58 will be subject to the interhalogen compound. On the other hand, the photoresist 50 extends across trench 58 to protect contact 60. The photoresist is typically needed only when an exposed layer, such as a metal contact, is exposed. The photoresist is typically a material that is impervious to the interhalogen cleaning process. Polymer resins are known to be suitable photoresists for metal, silicon, silicon dioxide, silicon nitride, and other materials. Commercially available photoresists suitable for use with the present interhalogen cleaning process include product OCG ARCH2 available from OCG Micro Electronic Materials, Inc. located in Santa Clara, Calif. and Shipley 9549Q and 549Z, available from Shipley Company, Inc. located in Marlborough, Ma.

The present invention has now been described with reference to several embodiments described herein, particularly with respect to articles having surface features. It will be apparent to those skilled in the art that many changes can be made in the embodiments without departing from the scope of the invention. For example, articles having a planar structure and no surface features can also be cleaned using the method of the present invention. Thus, the scope of the present invention should not be limited to the structures described herein, but only to structures described by the language of the claims and the equivalents to those structures.

What is claimed is:

1. A method of removing a layer of silicon oxide from at least a portion of a surface feature provided on an article comprising silicon, the method comprising the steps of:

locating the article having the surface feature in a reaction chamber;

introducing an interhalogen compound reactive with the silicon oxide layer into the reaction chamber so as to remove the silicon oxide layer from the portion of the surface feature, the interhalogen compound forming volatile by-product gases upon reaction with the silicon oxide layer;

increasing a temperature in the reaction chamber during introduction of the interhalogen compound; and removing unreacted interhalogen compound and volatile by-product gases from the reaction chamber.

2. The method of claim 1 wherein the temperature is 3within a range of about −20° C. to about 700° C.

3. The method of claim 1 further including the step of increasing a temperature of the interhalogen compound prior to introducing the interhalogen compound into the reaction chamber.

4. The method of claim 1 wherein a pressure in the reaction chamber is within a range of about 0.0133 Pa to about 101,325 Pa.

5. The method of claim 1 further including the step of coating at least a portion of the article with a photoresistive layer impervious to the interhalogen compound.

6. The method of claim 1 further including the step of depositing in-situ a metal layer on a portion of the article within the reaction chamber.

7. The method of claim 1 wherein the reaction chamber comprises a chemical vapor deposition reaction chamber.

8. The method of claim 1 wherein the article comprises a silicon wafer.

9. The method of claim 1 wherein the interhalogen compound is selected from a group consisting of $ClF_3$, $BrF_3$, $ClF_5$, $IF_5$, $IF_7$, $ClF$, $BrCl$, $IBr$, $ICl$ and $BrF$.

10. The method of claim 1 wherein the interhalogen compound comprises an interhalogen gas.

11. The method of claim 10 wherein the interhalogen gas comprises a complex interhalogen gas.

12. The method of claim 1 wherein the interhalogen compound comprises a non-fluorine-containing interhalogen compound.

13. The method of claim 1 wherein the interhalogen compound comprises a high vapor pressure liquid at room temperature.

14. The method of claim 1 wherein the interhalogen compound comprises a solid at room temperature that sublimes upon heating to generate an interhalogen vapor.

15. The method of claim 1 wherein the surface feature comprises a depression with one or more lateral dimensions of less than about 2 micrometers.

16. The method of claim 1 wherein the surface feature comprises a depression with one or more lateral dimensions of less than about 0.5 micrometer.

17. The method of claim 1 wherein the surface feature has an aspect ratio comprising at least about 1:1.

18. The method of claim 1 wherein the surface feature has an aspect ratio comprising at least about 5:1.

19. A method of in-situ removal of a silicon oxide layer from a silicon wafer in a chemical vapor deposition chamber prior to metal deposition, comprising the steps of:

locating the silicon wafer in the deposition chamber;

introducing an interhalogen compound reactive with the silicon oxide layer into the deposition chamber so as to remove the silicon oxide layer from the silicon wafer;

increasing a temperature in the chamber during introduction of the interhalogen compound;

evacuating unreacted interhalogen compound and volatile by-product gases from the deposition chamber; and depositing a metal layer on a portion of the article within the deposition chamber.

20. A method of removing an oxide layer from a portion of a surface feature provided on an article having a non-silicon surface, comprising the steps of:

locating the article having the non-silicon surface and high aspect ratio surface feature in a reaction chamber, the surface feature having a high aspect ratio of depth relative to width of between about 1:1 and about 40:1;

introducing an interhalogen compound reactive with the oxide layer into the reaction chamber so as to remove the oxide layer from the portion of the surface feature, the interhalogen compound forming volatile by-product gases upon reaction with the oxide layer;

increasing a temperature in the chamber during introduction of the interhalogen compound; and evacuating unreacted interhalogen compound and volatile by-product gases from the reaction chamber.

21. The method of claim 20 wherein the interhalogen compound comprises a non-fluorine-containing interhalogen compound.

22. The method of claim 19 wherein the silicon wafer includes a surface feature having a high aspect ratio of depth relative to width of between about 1:1 and about 40:1.

23. The method of claim 19 wherein the silicon wafer includes a surface feature having a high aspect ratio of depth relative to width of between about 2:1 and about 20:1.

24. The method of claim 20 wherein the surface feature comprises a depression with one or more lateral dimensions of less than about 2 micrometers.

25. The method of claim 19 wherein the temperature is within a range of about −20° C. to about 700° C.

* * * * *